(12) United States Patent
Wu

(10) Patent No.: US 12,218,034 B2
(45) Date of Patent: Feb. 4, 2025

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei (CN)

(72) Inventor: Ping-Heng Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 339 days.

(21) Appl. No.: 17/650,659

(22) Filed: Feb. 10, 2022

(65) Prior Publication Data
US 2022/0165644 A1  May 26, 2022

Related U.S. Application Data

(63) Continuation of application No. PCT/CN2021/110133, filed on Aug. 2, 2021.

(30) Foreign Application Priority Data

Nov. 16, 2020  (CN) .......................... 202011281266.X

(51) Int. Cl.
H01L 23/48 (2006.01)
H01L 21/768 (2006.01)
(Continued)

(52) U.S. Cl.
CPC ...... *H01L 23/481* (2013.01); *H01L 21/76898* (2013.01); *H01L 23/5226* (2013.01);
(Continued)

(58) Field of Classification Search
CPC ............ H01L 23/481; H01L 21/76898; H01L 23/5226; H01L 23/528; H01L 23/522;
(Continued)

(56) References Cited

U.S. PATENT DOCUMENTS 7,633,167 B2  12/2009 Kawano
7,892,973 B2   2/2011 Kawano
(Continued)

FOREIGN PATENT DOCUMENTS

CN  102299136 A  12/2011
CN  102263099 B   9/2013
(Continued)

OTHER PUBLICATIONS

Supplementary European Search Report in the European application No. 21865320.2, mailed on Nov. 10, 2022.
(Continued)

*Primary Examiner* — Patricia D Valenzuela
(74) *Attorney, Agent, or Firm* — Syncoda LLC; Feng Ma

(57) ABSTRACT

A semiconductor structure includes a base, a conductive pillar at least located in the base, connecting structures and an electrical connection layer. At least one connecting structure is electrically connected to an end of the conductive pillar, the material of the connecting structure is different from that of the conductive pillar, and a total area of an orthographic projection of the connecting structure on the base is less than an area of an orthographic projection of the conductive pillar on the base. The electrical connection layer is electrically connected to an end of the connecting structure distal from the conductive pillar.

12 Claims, 17 Drawing Sheets

(51) Int. Cl.
*H01L 23/522* (2006.01)
*H01L 23/528* (2006.01)
*H01L 23/498* (2006.01)

(52) U.S. Cl.
CPC ...... *H01L 23/49827* (2013.01); *H01L 23/522* (2013.01); *H01L 23/528* (2013.01)

(58) Field of Classification Search
CPC ........... H01L 23/5384; H01L 21/76838; H01L 21/76877; H01L 23/5386; H01L 2221/1068; H01L 23/49827
See application file for complete search history.

(56) References Cited

U.S. PATENT DOCUMENTS

| | | | |
|---|---|---|---|
| 7,939,449 | B2 | 5/2011 | Cobbley |
| 8,183,685 | B2 | 5/2012 | Kawano |
| 8,344,514 | B2 | 1/2013 | Cobbley |
| 8,390,120 | B2 | 3/2013 | Moon |
| 8,456,019 | B2 | 6/2013 | Kawano |
| 8,860,229 | B1 | 10/2014 | Lin |
| 8,872,310 | B2 | 10/2014 | Cobbley et al. |
| 9,147,642 | B2 | 9/2015 | Lin |
| 9,275,935 | B2 | 3/2016 | Kitao et al. |
| 9,779,992 | B2 | 10/2017 | Kitao et al. |
| 2007/0069364 | A1 | 3/2007 | Kawano |
| 2008/0136023 | A1 | 6/2008 | Komai |
| 2009/0294983 | A1 | 12/2009 | Cobbley |
| 2010/0048019 | A1 | 2/2010 | Kawano |
| 2011/0089572 | A1 | 4/2011 | Tezcan |
| 2011/0101541 | A1 | 5/2011 | Kawano |
| 2011/0180936 | A1 | 7/2011 | Cobbley |
| 2011/0316168 | A1 | 12/2011 | Moon |
| 2012/0098106 | A1 | 4/2012 | Aoki |
| 2012/0211872 | A1 | 8/2012 | Kawano |
| 2013/0140709 | A1 | 6/2013 | Matsuura |
| 2013/0187289 | A1 | 7/2013 | Cobbley |
| 2013/0249047 | A1 | 9/2013 | Hung |
| 2014/0061940 | A1 | 3/2014 | Kitao et al. |
| 2015/0035168 | A1 | 2/2015 | Tezcan et al. |
| 2015/0115462 | A1* | 4/2015 | Lin .................. H01L 23/49827 257/774 |
| 2015/0311116 | A1 | 10/2015 | Matsuura |
| 2016/0148841 | A1 | 5/2016 | Kitao et al. |
| 2017/0352592 | A1* | 12/2017 | Farooq .................... H01L 28/90 |
| 2019/0115314 | A1* | 4/2019 | Liu ..................... H01L 23/5386 |

FOREIGN PATENT DOCUMENTS

| | | |
|---|---|---|
| CN | 103367319 A | 10/2013 |
| CN | 103681616 A | 3/2014 |
| CN | 104600060 A | 5/2015 |
| WO | 2009115449 A1 | 9/2009 |

OTHER PUBLICATIONS

International Search Report in the international application No. PCT/CN2021/110133, mailed on Nov. 2, 2021.

* cited by examiner

SEMICONDUCTOR STRUCTURE AND METHOD FOR MANUFACTURING SEMICONDUCTOR STRUCTURE

CROSS-REFERENCE TO RELATED APPLICATIONS

This is a continuation of International Patent Application No. PCT/CN2021/110133 filed on Aug. 2, 2021, which claims priority to Chinese Patent Application No. 202011281266.X filed on Nov. 16, 2020. The disclosures of these applications are hereby incorporated by reference in their entirety.

BACKGROUND

Interconnection between chips or wafers in a semiconductor structure may be implemented through manufacturing via holes in a perpendicular direction, and the interconnection technology is called as a Through Silicon Via (TSV) technology. The traditional TSV is usually filled with a metal material to form a conductive pillar, and an end surface of the conductive pillar is in contact and electric connection with another electrical connection layer to implement electric connection among different layers.

SUMMARY

The embodiments of the disclosure provide a semiconductor structure. The semiconductor structure includes a base, a conductive pillar at least located in the base, connecting structures and an electrical connection layer. At least one connecting structure is electrically connected to an end of the conductive pillar, the material of the connecting structure is different from that of the conductive pillar, and a total area of an orthographic projection of the connecting structure on the base is less than an area of an orthographic projection of the conductive pillar on the base. The electrical connection layer is electrically connected to an end of the connecting structure distal from the conductive pillar.

The embodiments of the disclosure further provide a method for manufacturing a semiconductor structure. The method includes the following operations. A base is provided, and the base has a first surface and an opposite second surface. The base is etched to form a plurality of first vias and a plurality of second vias, the first surface exposes the first vias, and the second surface exposes the second vias. The first vias are filled to form connecting structures, the second vias are filled to form conductive pillars, at least one connecting structure is electrically connected to an end of one of the conductive pillars, the material forming the connecting structure is different from that forming the conductive pillar, and a total area of an orthographic projection of the connecting structure on the base is less than an area of an orthographic projection of the conductive pillar on the base. An electrical connection layer is formed at one side of the connecting structure distal from the conductive pillar.

BRIEF DESCRIPTION OF THE DRAWINGS

One or more the embodiments are illustrated by pictures in the corresponding drawings. The pictures in the drawings do not constitute a proportional restriction unless stated otherwise.

DETAILED DESCRIPTION

Figure 1:
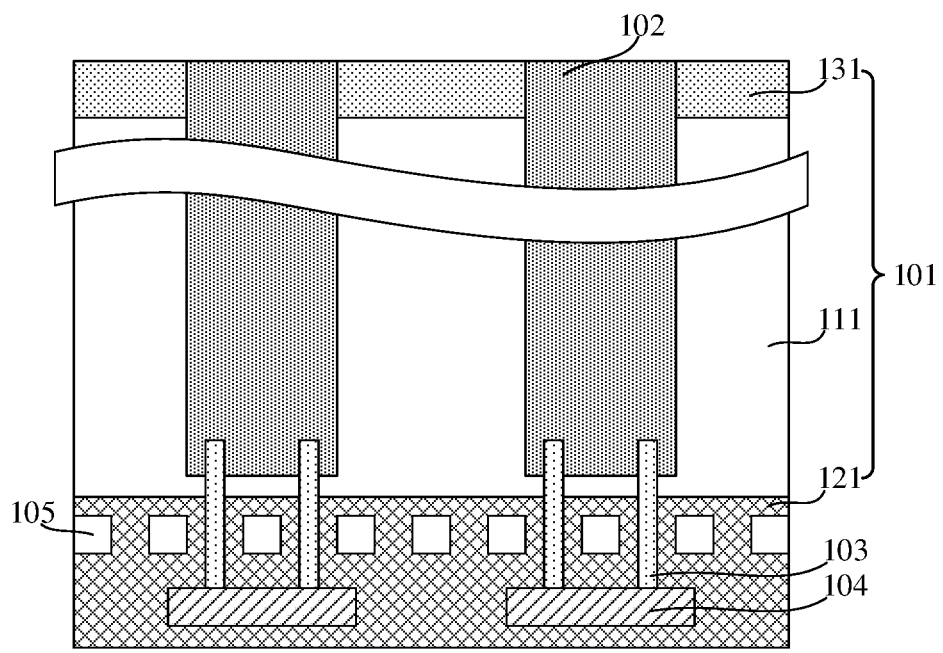
FIG. 1 is a schematic diagram illustrating a sectional structure of a semiconductor structure according to an embodiment of the disclosure.

When the end surface of the conductive pillar directly contacts with that of the electrical connection layer, no spacing is provided between the conductive pillar and the electrical connection layer, so a circuit may not be designed between the conductive pillar and the electrical connection layer. In addition, when the conductive pillar expands due to heating, it is easy to cause extrusion on a structure adjacent to the conductive pillar, so a semiconductor Keep Out Zone (KOZ) is also arranged around the conductive pillar, and circuit layout and design cannot be performed in the KOZ. Therefore, the direct contact of the conductive pillar and the electrical connection layer and the existence of the KOZ may reduce an area for designing the circuit layout.

In some implementations, the direct contact of the conductive pillar and the electrical connection layer and the existence of the KOZ may reduce an area for designing the circuit layout.

It has been found through analysis that a blank area where the conductive pillar is designed needs to be reserved when designing the circuit layout in the semiconductor structure, such that the conductive pillar may subsequently pass through the reserved blank area, but in such case, the area for designing the circuit layout may be reduced. In addition, an area close to the conductive pillar is easily affected by thermal stress when the conductive pillar is thermally expanded, so a peripheral area (KOZ) close the conductive pillar is unavailable for the circuit layout and design, further reducing the area for designing the circuit layout.

The embodiments of the disclosure provide a semiconductor structure, in which a conductive pillar is connected to an electrical connection layer through a connecting structure, and a total area of an orthographic projection of the connecting structure on a base is less than an area of an orthographic projection of the conductive pillar on the base. A current of an electric signal transferred by the conductive pillar is relatively small, and thus it is not necessary for the whole end surface of the conductive pillar to be in contact with the electrical connection layer, and the stability of the electric signal transmission between the conductive pillar and the electrical connection layer may be ensured through a small connecting structure. Further, the material of the connecting structure is different from that of the conductive pillar, and a periphery of the connecting structure and intervals of a plurality of connecting structures may be used for design of the circuit layout, which is beneficial to increase the area for designing the circuit layout in the semiconductor structure.

Various embodiments of the disclosure are described in details below in combination with the drawings. However, those of ordinary skill in the art may understand that, in various embodiments of the disclosure, technical details are provided for readers to understand the disclosure better., but even without these technical details as well as various changes and modifications based on the embodiments below, the technical solution protected by the disclosure may also be implemented.

Figure 2:
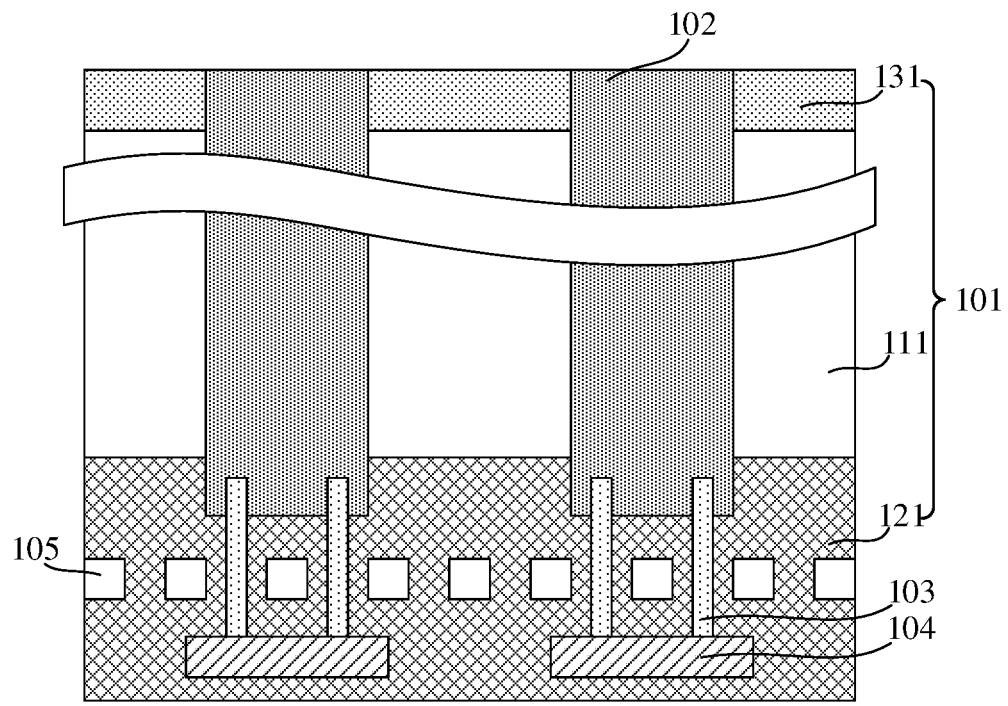
FIG. 2 is a schematic diagram illustrating another sectional structure of a semiconductor structure according to an embodiment of the disclosure.
Figure 3:
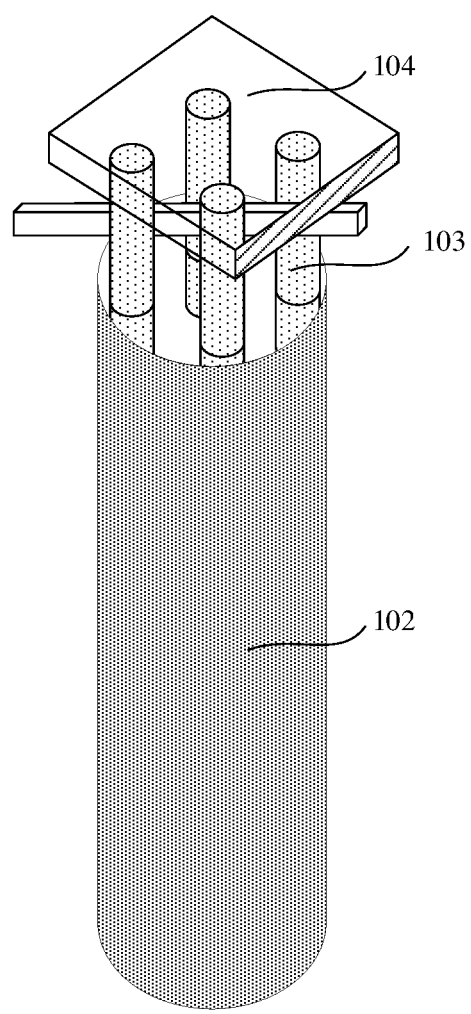
FIG. 3 is a schematic diagram illustrating a local three-dimensional structure of a semiconductor structure according to an embodiment of the disclosure.

FIG. 1 is a schematic diagram illustrating a sectional structure of a semiconductor structure according to an embodiment of the disclosure, FIG. 2 is a schematic diagram illustrating another sectional structure of a semiconductor structure according to an embodiment of the disclosure, and FIG. 3 is a schematic diagram illustrating a local three-dimensional structure of a semiconductor structure according to an embodiment of the disclosure.

Referring to FIG. 1, the semiconductor structure in the embodiments of the disclosure includes a base 101, a conductive pillar 102 at least located in the base 101, connecting structures 103 and an electrical connection layer 104. At least one connecting structure 103 is electrically connected to an end of the conductive pillar 102, the material of the connecting structure 103 is different from that of the conductive pillar 102, and a total area of an orthographic projection of the connecting structure 103 on the base 101 is less than an area of an orthographic projection of the conductive pillar 102 on the base 101. The electrical connection layer 104 is electrically connected to an end of the connecting structure 103 distal from the conductive pillar 102.

In the embodiments of the disclosure, the conductive pillar 102 may implement an electric connection to the electrical connection layer 104 through one or more connecting structures 103, so as to implement the electric signal transmission between the conductive pillar 102 and the electrical connection layer 104. In addition, the total area of the orthographic projection of the connecting structure 103 on the base 101 is less than the area of the orthographic projection of the conductive pillar 102 on the base 101, such that both the connecting structure 103 and an area for designing the circuit layout are provided between the conductive pillar 102 and the electrical connection layer 104, which is beneficial to increase the area for designing the circuit layout in the semiconductor structure.

In some embodiments, the base 101 includes a substrate 111 and a dielectric layer 121 stacked in sequence, and the electrical connection layer 104 is located in the dielectric layer 121. In other embodiments, the base 101 may also include a third dielectric layer 131, which is located at one side of the substrate 111 distal from the dielectric layer 121.

In an example, still referring to FIG. 1, each connecting structure 103 is located in the dielectric layer 121 and the substrate 111. Correspondingly, the conductive pillar 102 is located in the third dielectric layer 131 and part of the substrate 111, so a spacing between the conductive pillar 102 and a first structure 105 is provided with the substrate 111 and the dielectric layer 121. When the conductive pillars 102 is thermally expanded, the substrate 111 and the dielectric layer 121 may be used as stress buffer layers, to reduce the extrusion influence of the conductive pillar 102 on the first structure 105.

In some embodiments, referring to FIG. 2, each connecting structure 103 is only located in the dielectric layer 121, the conductive pillar 102 penetrates through the substrate 111 and is also located in part of the substrate 121, so a spacing between the conductive pillar 102 and the first structure 105 is provided with the dielectric layer 121. When the conductive pillar 102 is thermally expanded, the dielectric layer 121 may be used as a stress buffer layer, to reduce the extrusion influence of the conductive pillar 102 on the first structure 105.

In the embodiments of the disclosure, the dielectric layer 121 and the third dielectric layer are material layers with low thermal expansion coefficient, for example, silicon dioxide layers, silicon oxide layers, silicon nitride layers, silicon carbon nitrogen. The substrate 111 is a semiconductor substrate, for example, a silicon substrate, a germanium substrate, a silicon germanium substrate or a silicon carbide substrate.

Referring to FIG. 3, the connecting structure 103 is provided with a first end surface and a second end surface opposite to the first end surface. The first end surface is embedded into the conductive pillar 102, and the second end surface is in contact with an end surface of the electrical connection layer 104. In other embodiments, a position relationship among the connecting structure, the conductive pillar and the electrical connection layer may also be that: the first end surface is in contact with the end surface of the conductive pillar, and the second end surface is in contact with the end surface of the electrical connection layer, or the first end surface is embedded into the conductive pillar, and the second end surface is embedded into the electrical connection layer, or the first end surface is in contact with the end surface of the conductive pillar, and the second end surface is embedded into the electrical connection layer.

The ratio of the total area of the orthographic projection of the connecting structure 103 on the substrate 101 to the area of the orthographic projection of the conductive pillar 102 on the substrate 101 is ranged from $1/10$ to $1/5$.

In the embodiments of the disclosure, compared with a cross sectional area of the conductive pillar 102 (i.e., the area of the orthographic projection of the conductive pillar 102 on the base 101), a cross sectional area of the connecting structure 103 (i.e., the area of the orthographic projection of the connecting structure 103 on the base 101) is smaller, such that there is an area for designing the circuit layer in the spacing between the conductive pillar 102 and the electrical connection layer 104, namely, another structure may be arranged, which is beneficial to improve the space utilization rate of the semiconductor structure. Moreover, under a premise of ensuring the stability of the electric signal transmission between the conductive pillar 102 and the electrical connection layer 104, the smaller the ratio of the cross sectional area of the connecting structure 103 to the cross sectional area of the conductive pillar 102, the greater the area for designing the circuit layout.

In the embodiments of the disclosure, the conductive pillar 102 may be a TSV, which is usually made of copper, gold, silver, tungsten and other metal materials.

In addition, the thermal expansion coefficient of the material of the conductive pillar 102 is greater than that of the material of the connecting structure 103. The thermal expansion coefficient of the material of the connecting structure 103 may also be less than that of the material of the electrical connection layer 104.

Therefore, when a temperature of an environment where the semiconductor structure is located is high, a significant volume expansion is not occurred to the connecting structure 103 when the connecting structure 103 is heated, the generated thermal stress is small, so there is no significant extrusion influence on a structure around the connecting structure 103, and the circuit layout may also be designed in the area especially close to the connecting structure 103, further increasing the area for designing the circuit layout. In addition, thermal stress generated by the connecting structure 103 due to heating is small, and thus the extrusion influence of the connecting structure 103 on the conductive pillar 102 and the electrical connection layer 104 that are electrically connected to the connecting structure 103 is small, which is beneficial to improve the stability of the electrical connection of the connecting structure 103 with the conductive pillar 102 and the electrical connection layer 104.

The material of the connecting structure 103 includes doped polycrystalline silicon and a metal material.

In some embodiments, the doped polycrystalline silicon includes P-type doped polycrystalline silicon and N-type doped polycrystalline silicon. The metal material includes at least one of metal materials with a low thermal expansion coefficient, for example, tungsten, titanium, gold, nickel and palladium.

In the embodiments of the disclosure, still referring to FIG. 1, the semiconductor structure further includes at least one first structure 105, and part of the first structures 105 are arranged around a connecting structure 103 or interspersed in the intervals of the plurality of connecting structures 103. The first structures 105 are configured to generate or transmit the electric signal of the semiconductor structure.

A part of the first structures 105 are arranged in the spacings between the conductive pillars 102 and the electrical connection layers 104, which is beneficial to increase the area for designing the circuit layout. Further, other structures arranged at the two sides of the conductive pillar 102 may implement the electric connection through the spacing between the conductive pillar 102 and the electrical connection layer 104, which is beneficial to improve the diversity of the electric connections between the structures in the semiconductor structure.

It is to be noted that the first structure may be an electronic component (a capacitor, a resistor, a potentiometer, etc.) or a wire. The embodiments of the disclosure do not make any limitation to the type of the first structure.

Figure 12:
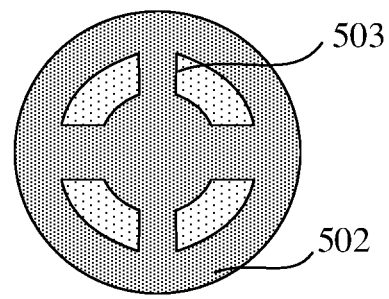
FIG. 12 is a first schematic diagram illustrating a plan view of a structure composed of a conductive pillar and a connecting structure in a semiconductor structure according to an embodiment of the disclosure.
Figure 13:
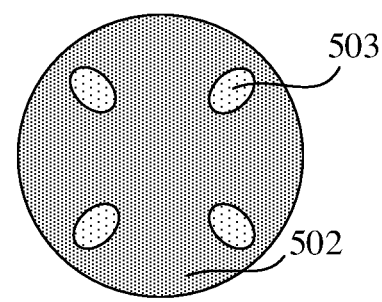
FIG. 13 is a second schematic diagram illustrating a plan view of a structure composed of a conductive pillar and a connecting structure in a semiconductor structure according to an embodiment of the disclosure.

In the embodiments of the disclosure, the distribution of part of the connection structures 103 and the first structures 105 in the semiconductor structure may be described below in combination with FIG. 4 to FIG. 11. FIG. 4 to FIG. 11 are schematic diagrams illustrating several plan structures of a structure composed of a conductive pillar, a connecting structure and a first structure in the semiconductor structure according to the embodiments of the disclosure, and FIG. 12 to FIG. 13 are schematic diagrams illustrating two plans structures of a structure composed of a conductive pillar and a connecting structure in a semiconductor structure according to the embodiments of the disclosure.

Figure 4:
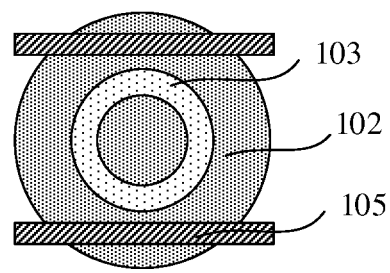
FIG. 4 is a first schematic diagram illustrating a plan view of a structure composed of a conductive pillar, a connecting structure and a first structure in a semiconductor structure according to an embodiment of the disclosure.
Figure 5:
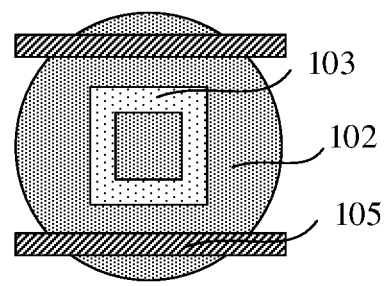
FIG. 5 is a second schematic diagram illustrating a plan view of a structure composed of a conductive pillar, a connecting structure and a first structure in a semiconductor structure according to an embodiment of the disclosure.

In Example 1, referring to FIG. 4 and FIG. 5, one connecting structure 103 encloses a closed ring structure, and the first structures 105 are located around the connecting structure 103. A central axis of the connecting structure 103 coincides with that of the conductive pillar 102.

In some embodiments, referring to FIG. 4, the single connecting structure 103 is a closed circular ring structure, and the first structures 105 are in an elongated shape and located at the two sides of the connecting structure 103. Alternatively, referring to FIG. 5, the single connecting structure 103 is a closed square ring structure, and the first structures 105 are in an elongated shape and located at the two sides of the connecting structure 103.

Figure 6:
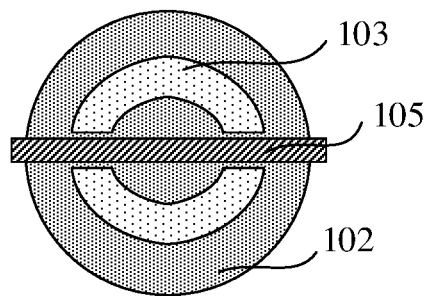
FIG. 6 is a third schematic diagram illustrating a plan view of a structure composed of a conductive pillar, a connecting structure and a first structure in a semiconductor structure according to an embodiment of the disclosure.
Figure 7:
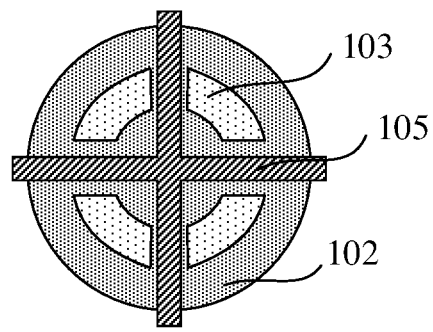
FIG. 7 is a fourth schematic diagram illustrating a plan view of a structure composed of a conductive pillar, a connecting structure and a first structure in a semiconductor structure according to an embodiment of the disclosure.
Figure 8:
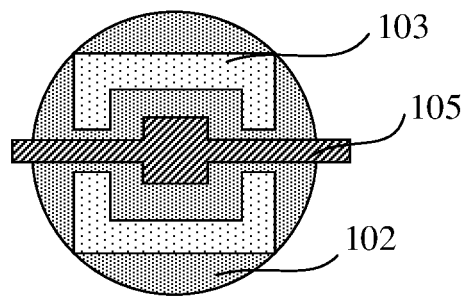
FIG. 8 is a fifth schematic diagram illustrating a plan view of a structure composed of a conductive pillar, a connecting structure and a first structure in a semiconductor structure according to an embodiment of the disclosure.

In Example 2, referring to FIG. 6 to FIG. 8, at least two connecting structures 103 enclose a ring structure, and the first structure 105 is located in the spacing of the plurality of connecting structures 103. A central axis of the ring structure enclosed by the connecting structure 103 coincides with that of the conductive pillar 102.

In some embodiments, referring to FIG. 6, two connecting structures 103 enclose a circular ring structure, and the first structure 105 is in an elongated shape and located in the spacing of the two connecting structures 103. Alternatively, referring to FIG. 7, four connecting structures 103 enclose a circular ring structure, the first structure 105 is cross-shaped, located at the central axis of the conductive pillar 102 and also located in the spacing of every two adjacent connecting structures 103. Alternatively, referring to FIG. 8, two connecting structures 103 enclose a square ring structure, the first structure 105 is a combined structure formed by a square structure located at the central axis of the conductive pillar 102 and elongated structures at the two sides of the square structure. In other embodiments, the structure located at the central axis of the conductive pillar may also be a rectangular structure, a circular structure, an elliptical structure or the like.

Figure 9:
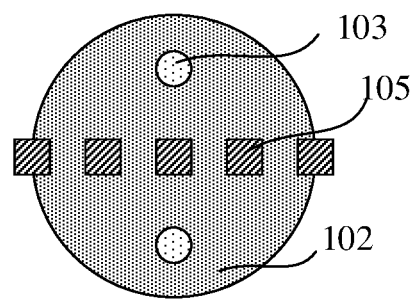
FIG. 9 is a sixth schematic diagram illustrating a plan view of a structure composed of a conductive pillar, a connecting structure and a first structure in a semiconductor structure according to an embodiment of the disclosure.
Figure 10:
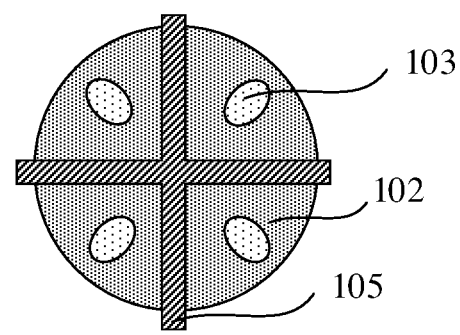
FIG. 10 is a seventh schematic diagram illustrating a plan view of a structure composed of a conductive pillar, a connecting structure and a first structure in a semiconductor structure according to an embodiment of the disclosure.

In Example 3, referring to FIG. 9 and FIG. 10, at least two connecting structures 103 are spaced around the central axis of the conductive pillar 102, and the first structures 105 are located in the spacing of the plurality of connecting structures 103.

In some embodiments, referring to FIG. 9, two connecting structures 103 are uniformly spaced around the central axis of the conductive pillar 102, the sectional shape of a connecting structure 103 (i.e., the shape of the orthographic projection of the connecting structure 103 on the base 101) is circular, the plurality of first structures 105 are uniformly arranged in the spacing of the two connecting structures 103, and the sectional shape of the first structure 105 (i.e., the shape of the orthographic projection of the first structure 105 on the base 101) is rectangular. Alternatively, referring to FIG. 10, four connecting structures 103 are uniformly spaced around the central axis of the conductive pillar 102, the sectional shape of a connecting structure 103 is elliptical, the first structure 105 is cross-shaped, located at the central axis of the conductive pillar 102 and also located in the spacing of every two adjacent connecting structures 103.

Figure 11:
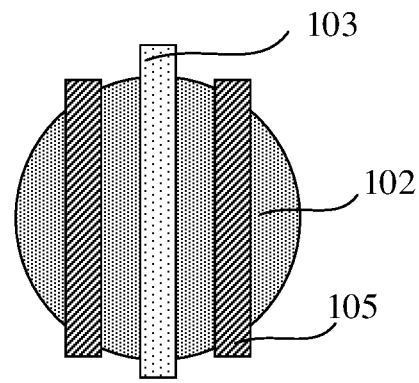
FIG. 11 is an eighth schematic diagram illustrating a plan view of a structure composed of a conductive pillar, a connecting structure and a first structure in a semiconductor structure according to an embodiment of the disclosure.

In Example 4, referring to FIG. 11, the connecting structure 103 and the first structures 105 are fin-shaped structures, and the first structures 105 are located at the two sides of the connecting structure 103. The central axis of the connecting structure 103 coincides with that of the conductive pillar 102, and the first structures 105 are mutually parallel to the connecting structure 103.

It is to be noted that, in the Example 1 to Example 4, the sectional shape of the conductive pillar 102 (i.e., the shape of the orthographic projection of the conductive pillar 102 on the base 101) is circular. In other embodiments, the sectional shape of the conductive pillar may also be other shapes.

In the case that the conductive pillar 102, the connecting structure 103 and the first structure 105 meet the position relationship of any one of the above situations, the embodiments of the disclosure do not actually limit the sectional shapes of the conductive pillar 102, the connecting structure 103 and the first structure 105.

In other embodiments, referring to FIG. 12 and FIG. 13, the first structure may also be not located in the spacing of the plurality of connecting structures 503, and the orthographic projection of the first structure on the base may also be not within the orthographic projection of the conductive pillar 502 in the base. Since there is a spacing between the conductive pillar 502 and the electrical connection layer, and there is no KOZ around the spacing area, the first structure may be located around the spacing area rather than being located in the spacing area, thereby increasing the area for designing the circuit layout in the semiconductor structure.

In the embodiments of the disclosure, the first structure is located at the two sides of the connecting structure or the first structure is located in the spacing of at least two connecting structures, and the orthographic projection of the first structure on the base is partially within the orthographic projection of the conductive pillar on the base, which is beneficial to design the circuit layout by using the spacing between the conductive pillar and the electrical connection layer, increase the design area of the circuit layout and improve the space utilization rate in the semiconductor structure.

The embodiments of the disclosure further provide a semiconductor structure. The embodiments are substantially the same as the previous embodiments, and the main difference is that the connecting structure in the semiconductor structure is also electrically connected to the first structure. The semiconductor structure provided by the embodiments of the disclosure is described below in combination with the drawings. It is to be noted that the same or corresponding part as the previous the embodiments may make reference to the detail description of the previous the embodiments, which are not elaborated herein.

Figure 14:
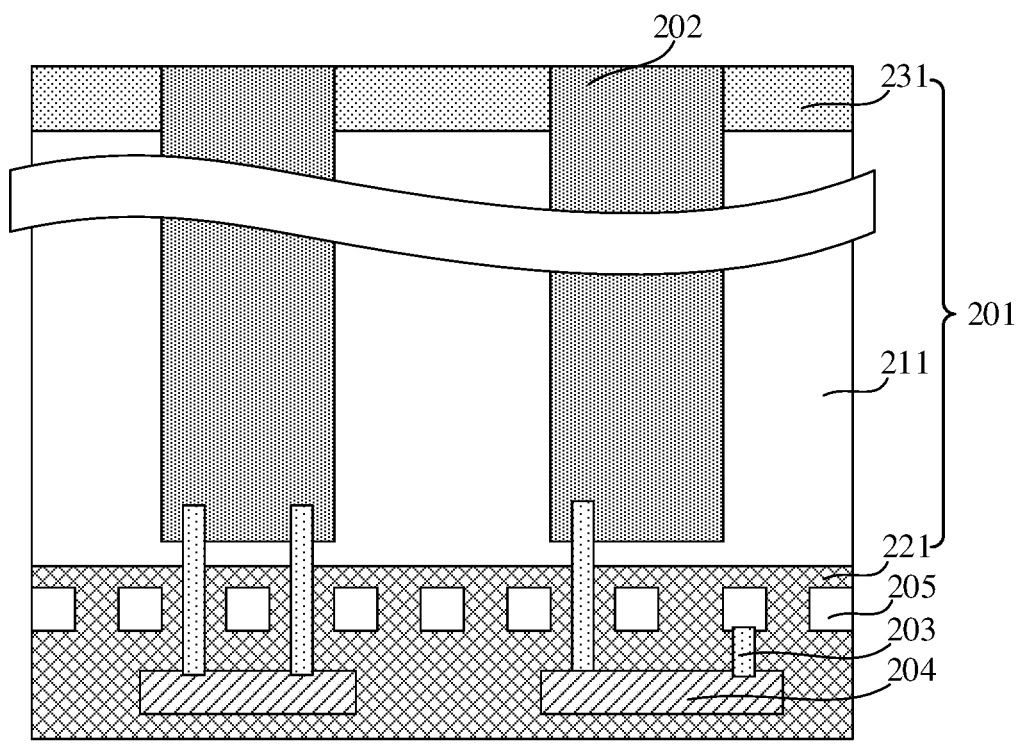
FIG. 14 is a schematic diagram illustrating a sectional structure of a semiconductor structure according to an embodiment of the disclosure.

FIG. 14 is a schematic diagram illustrating a sectional structure of a semiconductor structure according to an embodiment of the disclosure.

Referring to FIG. 14, in the embodiment of the disclosure, the semiconductor structure includes a base 201, a conductive pillar 202 at least located in the base 201, at least two connecting structures 203 and a plurality of first structures 205, and an electrical connection layer 204. At least one connecting structure 203 is electrically connected to an end of the conductive pillar 203, at least one connecting structure 203 is electrically to the first structure 205, the materials of the connecting structures 203 are different from the material of the conductive pillar 202, and a total area of an orthographic projection of a connecting structure 203 on the base 201 is less than an area of an orthographic projection of the conductive pillar 202 on the base 201. The electrical connection layer 204 is electrically connected to an end of the connecting structures 203 distal from the conductive pillar 202.

In the embodiments of the disclosure, the electric signal transmitted by the conductive pillar 202 may be only transmitted to the electrical connection layer 204 through the connecting structures 203, and may also be transmitted to the electrical connection layer 204 through a connecting structure 203 and then transmitted to the first structure 205 through a connecting structure 203, which is beneficial to improve the diversity of the signal transmission in the semiconductor structure.

The embodiments of the disclosure further provide a method for manufacturing a semiconductor structure, and the method may be used for manufacturing the semiconductor structure provided by the above the embodiments. FIG. 15 to FIG. 20 are schematic diagrams illustrating sectional structures corresponding to various steps of the method for manufacturing a semiconductor structure according to an embodiment of the disclosure. FIG. 21 to FIG. 25 are schematic diagrams illustrating sectional structures corresponding to various steps of another method for manufacturing a semiconductor structure according to an embodiment of the disclosure.

In the embodiments of the disclosure, the method for manufacturing the semiconductor includes the following operations. Referring to FIG. 15 to FIG. 20, a base 301 is provided, and the base 301 has a first surface and a second surface opposite to the first surface.

In some embodiments, the base 301 includes a substrate 311 and a first dielectric layer 341 stacked in sequence. The first surface is a surface of the first dielectric layer 341, and a plurality of first structures 305 are arranged in the first dielectric layer 341.

A connecting structure 303, an electrical connection layer 304 and a conductive pillar 302 may be subsequently formed on the base 301. In the embodiments of the disclosure, the connecting structure 303 and the electrical connection layer 304 are formed firstly, and then the conductive pillar 302 is formed. Details are made below.

Referring to FIG. 15 to FIG. 20, the base 301 is etched to form a plurality of first vias 313 and a plurality of second vias 312. The first surface exposes the first vias 313, and the second surface exposes the second vias 312.

In the embodiments of the disclosure, the second vias 312 are formed after firstly forming the first vias 313. In some embodiments of the disclosure, the operation of forming the first vias 313 and the second vias 312 includes the following steps.

Figure 15:
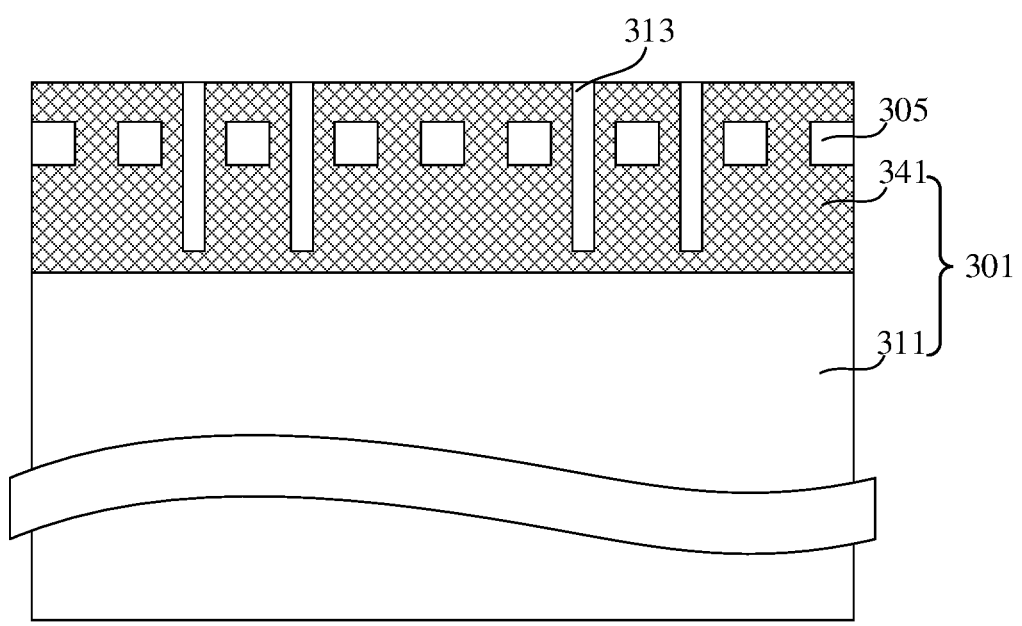
FIG. 15 is a first schematic diagram illustrating sectional structures corresponding to various steps of a method for manufacturing a semiconductor structure according to an embodiment of the disclosure.

Referring to FIG. 15, the first dielectric layer 341 is etched to form the plurality of first vias 313, and the first vias 313 are located in the spacings of the first structures 305.

In some embodiments, the etching process of forming the first vias 313 is as follows. A first photoresist pattern is formed on the first dielectric layer 341 by using a first photomask, and the first dielectric layer 341 is etched by using the first photoresist pattern as a mask to form the first vias 313.

Figure 16:
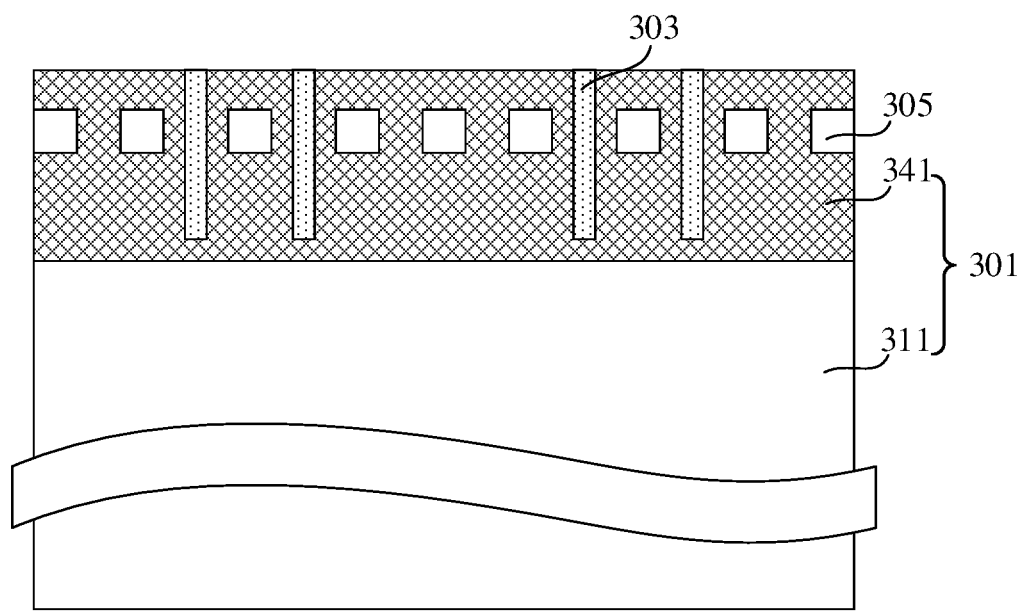
FIG. 16 is a second schematic diagram illustrating sectional structures corresponding to various steps of a method for manufacturing a semiconductor structure according to an embodiment of the disclosure.

Referring to FIG. 16, the first vias 313 (referring to FIG. 15) are filled to form the connecting structures 303.

In some embodiments, the filling material may include a silicon-containing material and a metal material. In some embodiments, the silicon-containing material may include at least one of silicon, silicon oxide, silicon nitride, silicon oxynitride, silicon carbide, silicon carbon nitrogen or silicon carbon oxide. The metal material may include a metal material with a low thermal expansion coefficient, such as at least one of tungsten, titanium, gold, nickel, or palladium. It is to be noted that the filling material for filling the plurality of first vias 313 in the same semiconductor may be the same or different.

In the embodiments of the disclosure, the process for forming the electrical connection layer at one side of the connecting structure includes the following operations.

Figure 17:
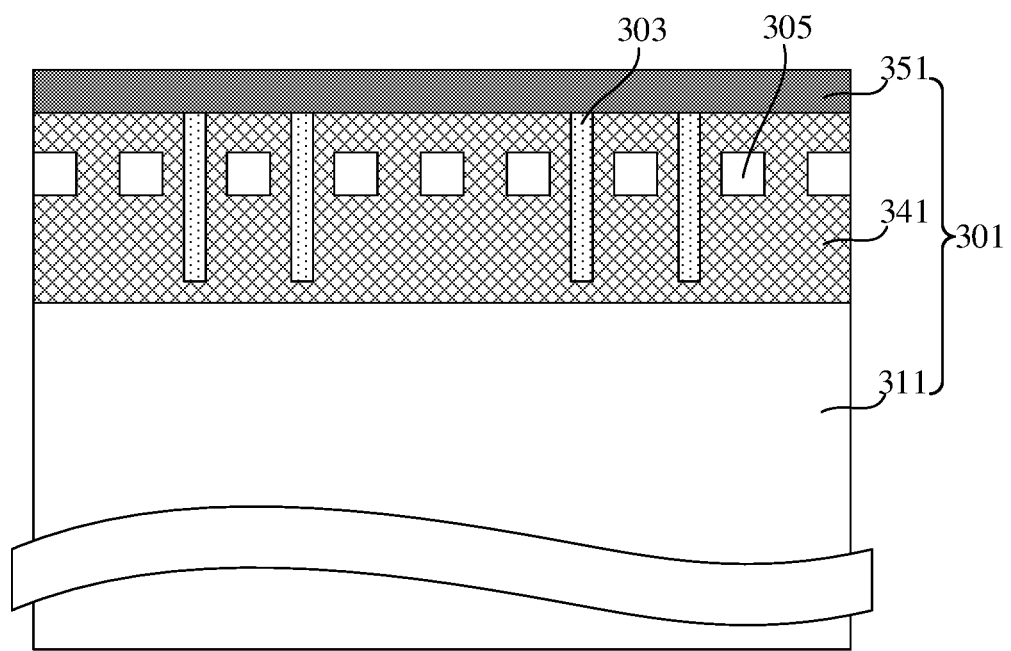
FIG. 17 is a third schematic diagram illustrating sectional structures corresponding to various steps of a method for manufacturing a semiconductor structure according to an embodiment of the disclosure.

Referring to FIG. 17, a second dielectric layer 351 is formed on the first dielectric layer 341.

In some embodiments, after the connecting structures 303 are formed and before the second dielectric layer 351 is formed, one side of the first dielectric layer 341 that exposes the surface of the connecting structure 303 is polished. For example, the polishing method includes chemical mechanical polishing.

Figure 18:
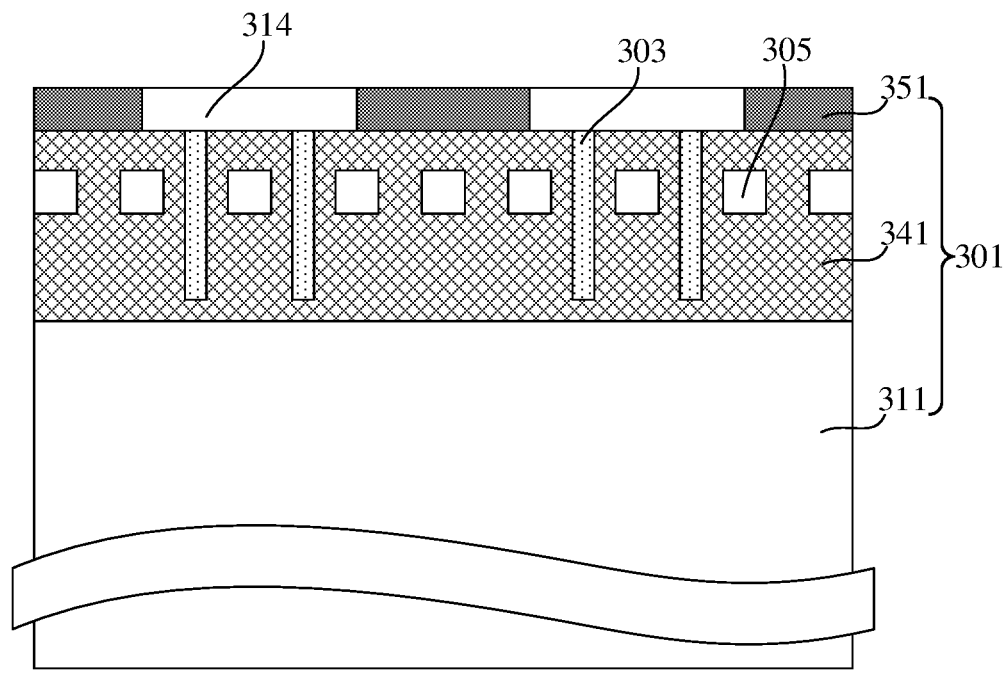
FIG. 18 is a fourth schematic diagram illustrating sectional structures corresponding to various steps of a method for manufacturing a semiconductor structure according to an embodiment of the disclosure.

Referring to FIG. 18, the second dielectric layer 351 is etched to form one or more third vias 314, and each third via 314 exposes one or more connecting structures 303.

In some embodiments, the etching process for forming the third vias 314 is as follows. A third photoresist pattern is formed on the second dielectric layer 351 by using a third photomask, and the second dielectric layer 351 is etched by using the third photoresist pattern as a mask to form the third vias 314.

In the embodiments of the disclosure, a third via 314 may only expose a surface of an end of the connecting structure 303, namely, the surface of the end of the connecting structure 303 is in contact with a surface of an end of the electrical connection layer subsequently formed. In other embodiments, the third via may also expose a part of one side of the connecting structure, namely, part of the connecting structure may be embedded into the electrical connection layer subsequently formed.

Figure 19:
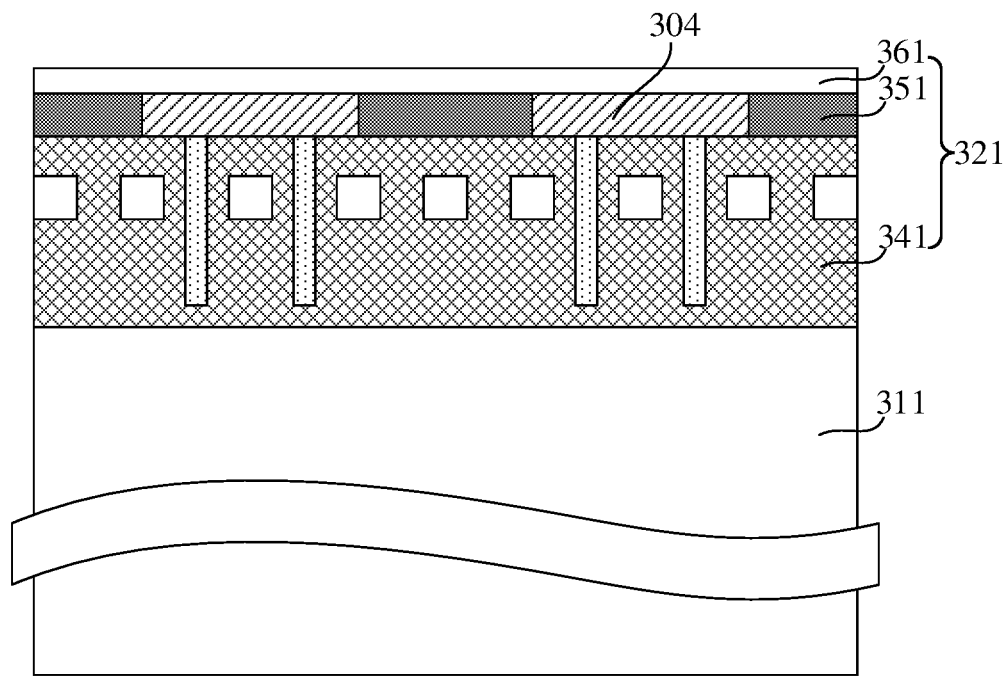
FIG. 19 is a fifth schematic diagram illustrating sectional structures corresponding to various steps of a method for manufacturing a semiconductor structure according to an embodiment of the disclosure.

Referring to FIG. 19, each third via 314 is filled to form the electrical connection layer 304.

In the embodiments of the disclosure, after the electrical connection layer 304 is formed, a fifth dielectric layer 361 is also formed at one side of the second dielectric layer 351 that exposes the surface of the electrical connection layer 304, to avoid exposure of the electrical connection layer 304 outside the semiconductor structure and prevent the electrical connection layer 304 from falling off the semiconductor structure.

It is to be noted that, in the embodiments of the disclosure, the first dielectric layer 341, the second dielectric layer 351 and the fifth dielectric layer 361 form the dielectric layer 321 together (the dielectric layer 312 corresponds to the dielectric layer 121 in FIG. 2 of the above embodiment). The first dielectric layer 341, the second dielectric layer 351 and the fifth dielectric layer 361 all are the material layers with low thermal expansion coefficients, such as silicon dioxide layers, silicon oxide layers or silicon nitride layers, silicon carbon nitrogen.

In the embodiments of the disclosure, the process for forming the second vias 312 and filling the second vias 312 to form the conductive pillars 302 includes the following operations.

Figure 20:
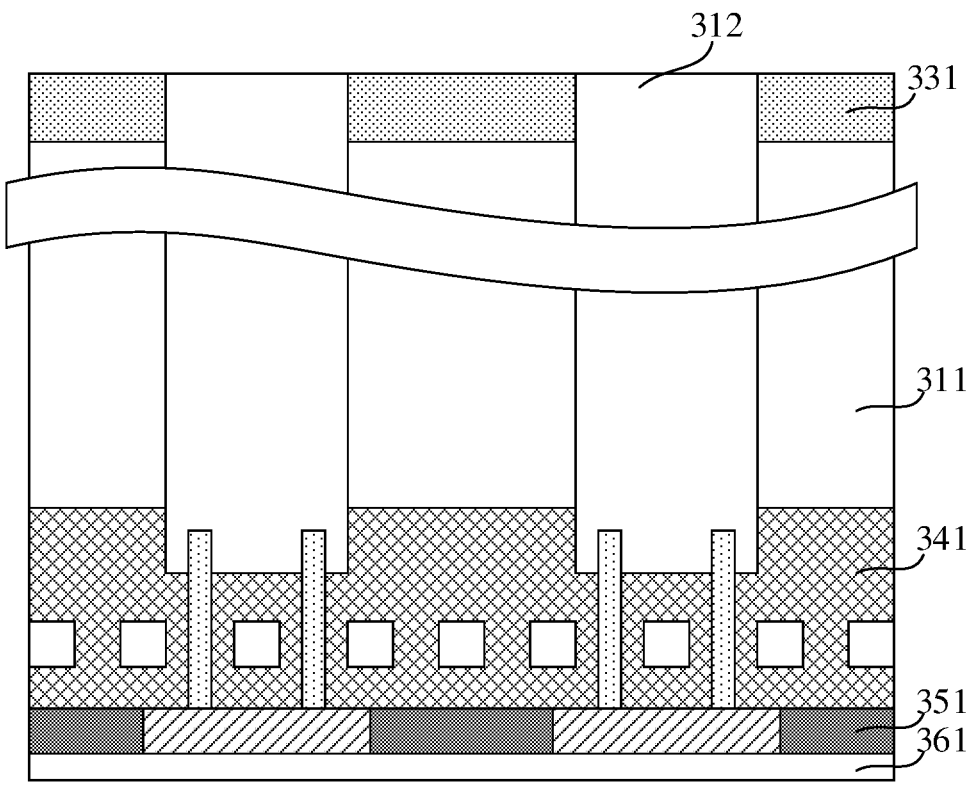
FIG. 20 is a sixth schematic diagram illustrating sectional structures corresponding to various steps of a method for manufacturing a semiconductor structure according to an embodiment of the disclosure.

Referring to FIG. 20, a third dielectric layer 331 is formed at one side, distal from the first dielectric layer 341, of the substrate 311. The third dielectric layer 331, the substrate 311 and the first dielectric layer 341 are etched to form the second vias 312, and the second vias 312 expose the connecting structures 303.

In the embodiments of the disclosure, before the third dielectric layer 331 is formed, the surface of the substrate 311 distal from the first dielectric layer 341 is polished, and for example, the polishing method includes chemical mechanical polishing.

In some embodiments, the etching process for forming the second vias 312 is as follows. A second photoresist pattern is formed on the third dielectric layer 331 by using a second photomask, and the third dielectric layer 331 is etched by using the second photoresist pattern as a mask to form the second vias 312.

In the embodiments of the disclosure, a second via 312 may expose a part of one side of the connecting structure 303, namely, part of the connecting structure 303 may be embedded into the conductive pillar subsequently formed. In other embodiments, the second via may also expose a surface of an end of the connecting structure, namely, the surface of the end of the connecting structure is in contact with a surface of an end of the conductive pillar subsequently formed.

Still referring to FIG. 2, each second via 312 (referring to FIG. 20) is filled to form the conductive pillar 102.

In the embodiments of the disclosure, the filling material for forming the conductive pillar 102 is copper. In other embodiments, the filling material for forming the conductive pillar 102 may be other metal materials, such as gold, silver or tungsten.

In the semiconductor structure provided by the embodiments of the disclosure, the connecting structure 303 is electrically connected to the end of the conductive pillar 302, the material for forming the connecting structure 303 is different from that for forming the conductive pillar 302, and the total area of the orthographic projection of the connecting structure 303 on the base 301 is less than the area of the orthographic projection of the conductive pillar 302 on the base 301.

In other embodiments, referring to FIG. 21 to FIG. 25, the conductive pillar 302 is formed on the base 301 firstly, and then the connecting structure 303 and the electrical connection layer 304 are formed.

Figure 21:
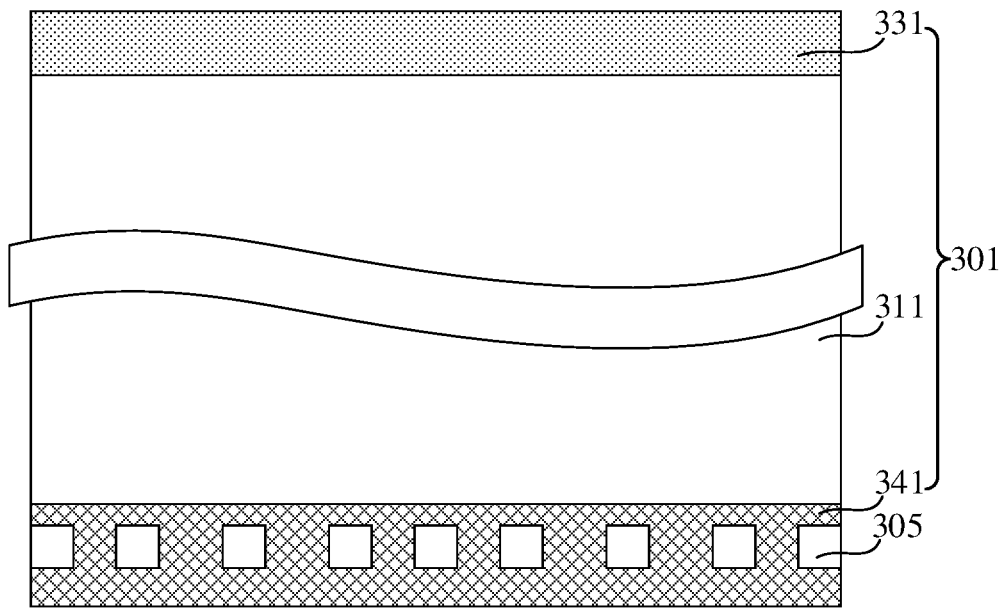
FIG. 21 is a first schematic diagram illustrating sectional structures corresponding to various steps of another method for manufacturing a semiconductor structure according to an embodiment of the disclosure.

In some embodiments, referring to FIG. 21, the surface of the substrate 311 distal from the first dielectric layer 341 is polished, and for example, the polishing method includes chemical mechanical polishing. Then, the third dielectric layer 331 is formed at one side of the substrate 311 distal from the first dielectric layer 341.

Figure 22:
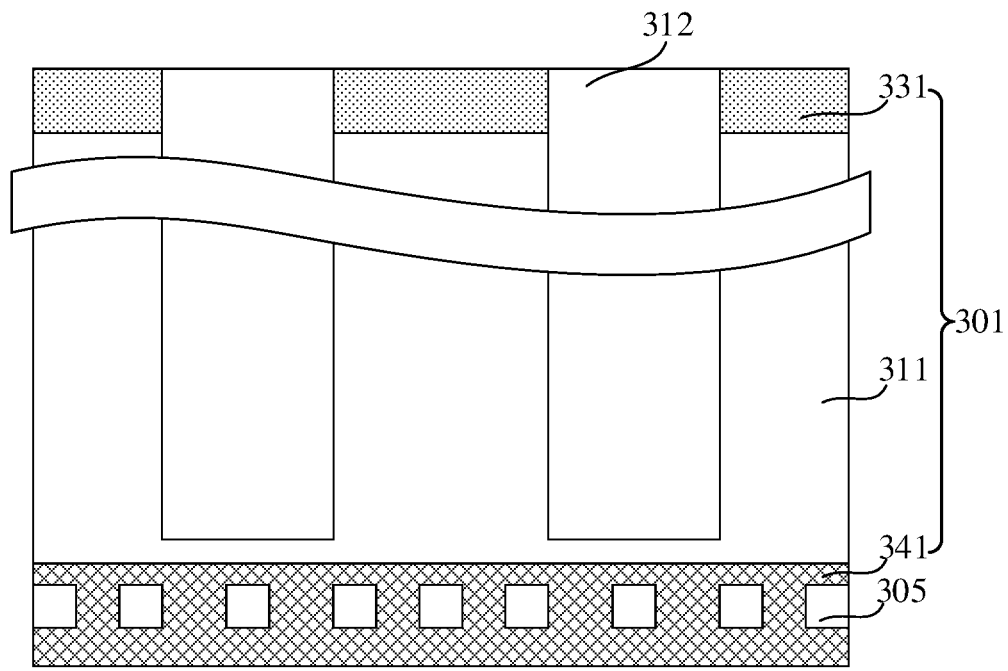
FIG. 22 is a second schematic diagram illustrating sectional structures corresponding to various steps of another method for manufacturing a semiconductor structure according to an embodiment of the disclosure.

Referring to FIG. 22, the third dielectric layer 331 and the substrate 311 are etched to form one or more second vias 312.

Figure 23:
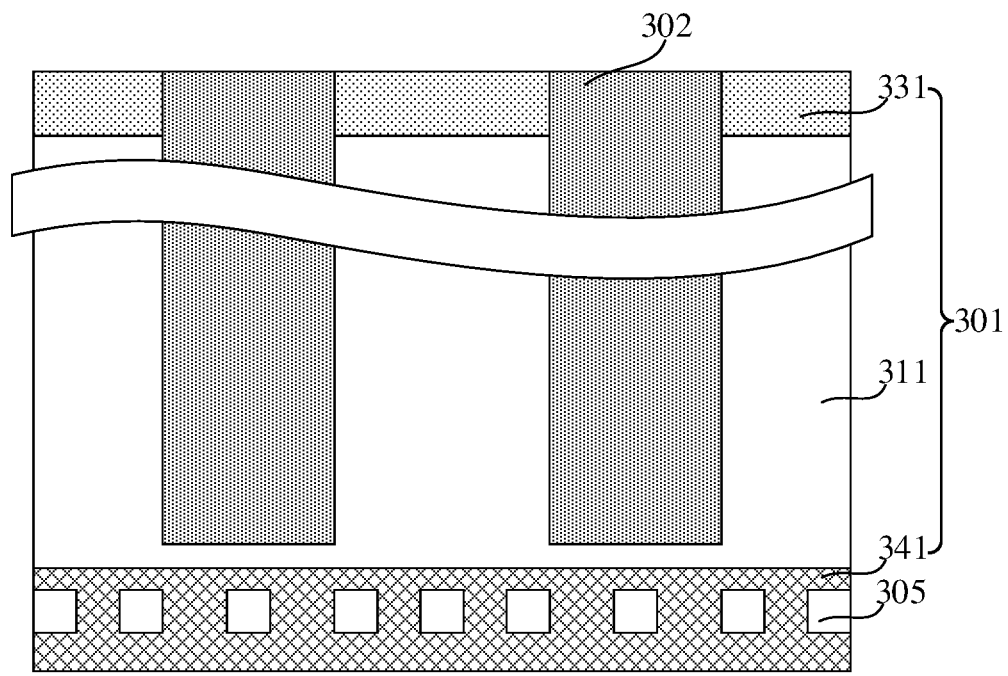
FIG. 23 is a third schematic diagram illustrating sectional structures corresponding to various steps of another method for manufacturing a semiconductor structure according to an embodiment of the disclosure.

Referring to FIG. 23, each second via 312 is filled to form the conductive structure 302.

Figure 24:
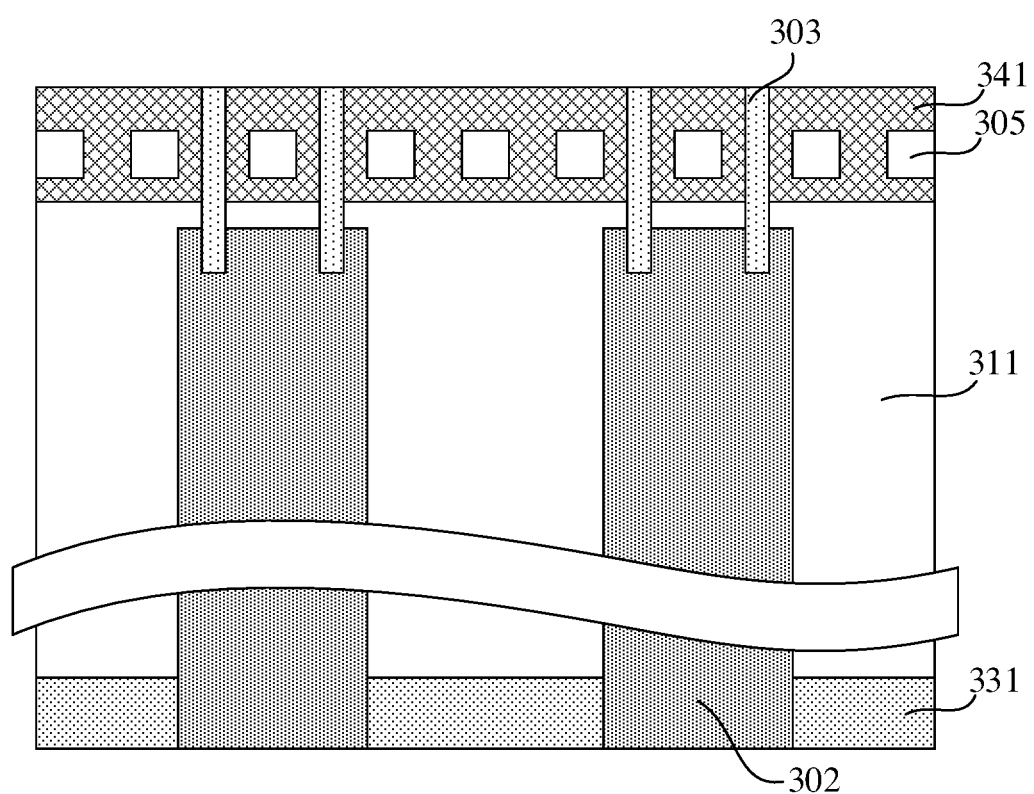
FIG. 24 is a fourth schematic diagram illustrating sectional structures corresponding to various steps of another method for manufacturing a semiconductor structure according to an embodiment of the disclosure.

Referring to FIG. 24, the first dielectric layer 341 is etched to form the plurality of first vias, and the first vias are located in the spacings of the first structures 30. Each first via is filled to form the connecting structure 303.

Figure 25:
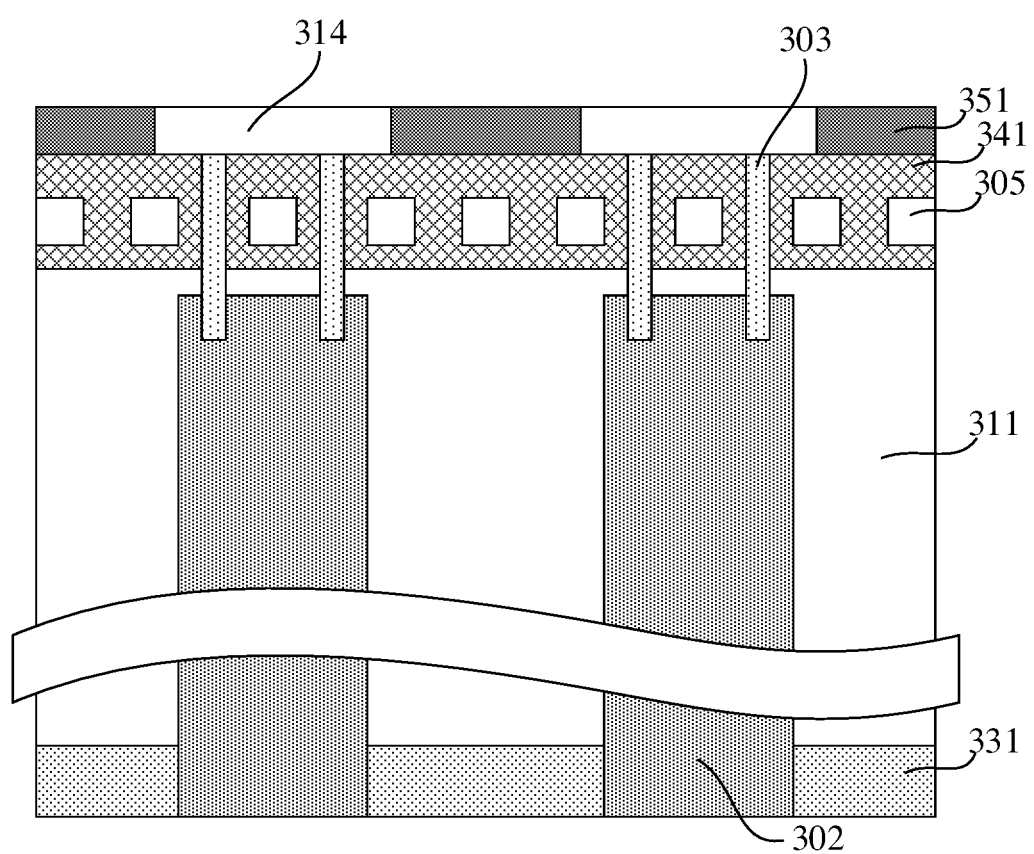
FIG. 25 is a fifth schematic diagram illustrating sectional structures corresponding to various steps of another method for manufacturing a semiconductor structure according to an embodiment of the disclosure.

Referring to FIG. 25, the second dielectric layer 351 is formed on the first dielectric layer 341. In some embodiments, after the connecting structure 303 is formed and before the second dielectric layer 351 is formed, one side of the first dielectric layer 341 that exposes the surface of the connecting structure 303 is polished, for example, the polishing method includes chemical mechanical polishing.

The second dielectric layer 351 is etched to form one or more third via 314, and each third via 314 exposes the connecting structure 303.

Still referring to FIG. 1, the third via 314 (referring to FIG. 25) is filled to form the electrical connection layer 104.

It is to be noted that, in the embodiments of the disclosure, the etching process for forming the first vias 313, the second vias 312 and the third vias 314 may be the same as the above embodiments.

In the embodiments of the disclosure, a process step for manufacturing the connecting structure is added in the process for manufacturing the conductive pillar and the electrical connection layer, and the total area of the orthographic projection of the connecting structure on the base is less than the area of the orthographic projection of the conductive pillar on the base, so that the stability of the electric signal transmission between the conductive pillar and the electrical connection layer may be ensured through a small connecting structure. In addition, the first structures may be arranged around the connecting structure and in the spacings of the plurality of connecting structures, which is beneficial to increase the area for designing the circuit layout in the semiconductor structure.

The embodiments of the disclosure further provide a method for manufacturing a semiconductor structure, and the method may be used for preparing the semiconductor structure provided by the above embodiments. Different from the above embodiments, at least one first via exposes the first structure. In the embodiments of the disclosure, FIG. 26 to FIG. 32 are schematic diagrams illustrating sectional structures corresponding to various steps of a method for manufacturing a semiconductor structure according to an embodiment of the disclosure. The same or corresponding part as the previous embodiments may make reference to the corresponding description of the previous embodiments, which are not elaborated below.

Figure 26:
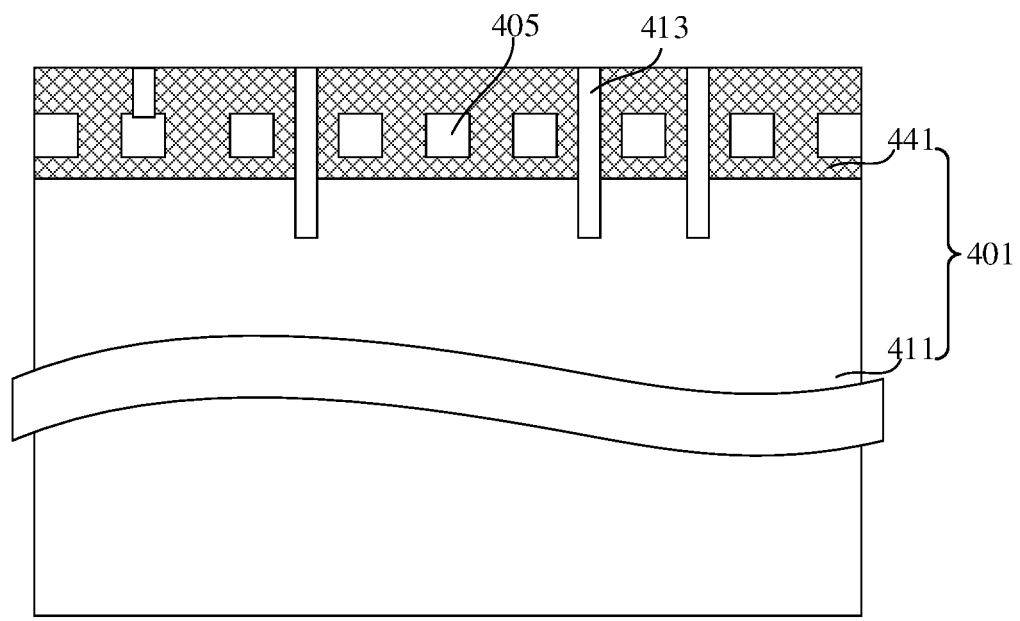
FIG. 26 is a first schematic diagram illustrating sectional structures corresponding to various steps of a method for manufacturing a semiconductor structure according to an embodiment of the disclosure.

In some embodiments, referring to FIG. 26, the base 401 includes a substrate 411 and a first dielectric layer 441 stacked in sequence, the first surface is a surface of the first dielectric layer 441, and a plurality of first structures 405 are arranged in the first dielectric layer 441.

In the embodiments of the disclosure, the connecting structure 403 and the electrical connection layer 404 are firstly formed, and then the conductive pillar 402 is formed. Details are made below.

Still referring to FIG. 26, the first dielectric layer 441 is etched to form the plurality of first vias 413, and at least one first via 413 exposes the first structure 405.

Figure 27:
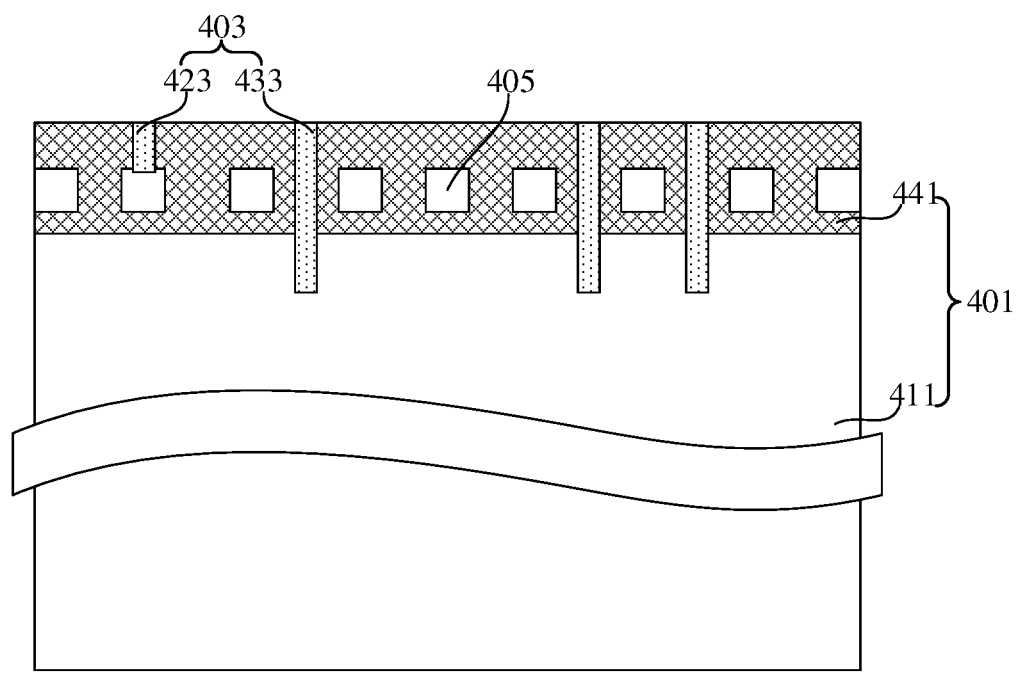
FIG. 27 is a second schematic diagram illustrating sectional structures corresponding to various steps of a method for manufacturing a semiconductor structure according to an embodiment of the disclosure.

Referring to FIG. 27, the first vias 413 are filled to form the connecting structure 403. The connecting structure 403 includes a first connecting structure 423 and a second connecting structure 433. The first connecting structure 423 is in contact with the first structure 405, and the second connecting structure 433 is located in the spacing between the adjacent first structures 405.

Figure 28:
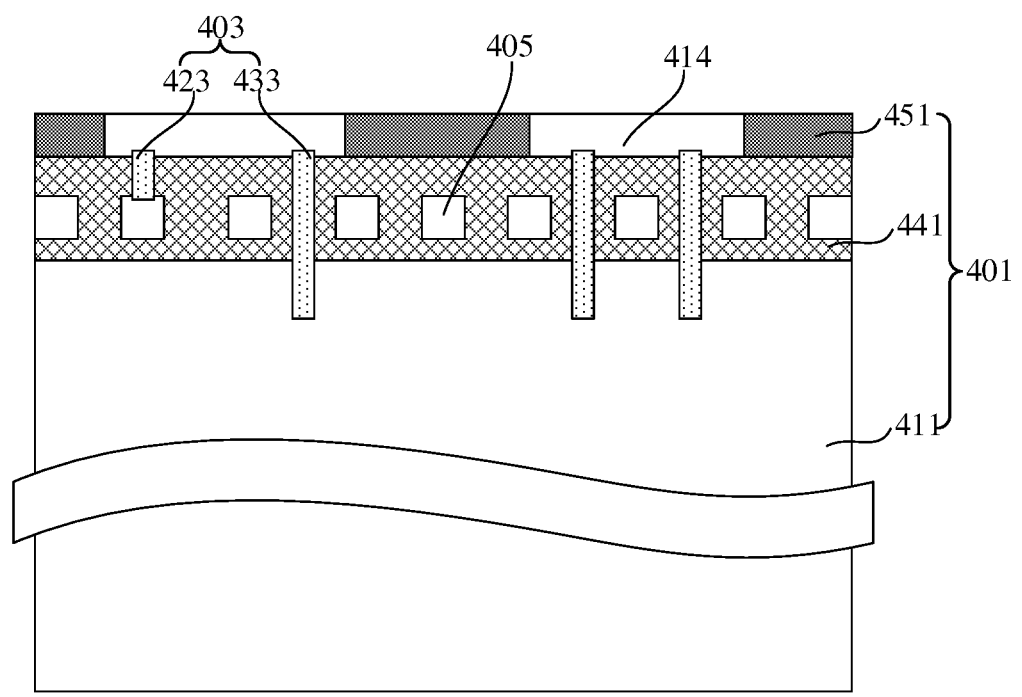
FIG. 28 is a third schematic diagram illustrating sectional structures corresponding to various steps of a method for manufacturing a semiconductor structure according to an embodiment of the disclosure.

Referring to FIG. 28, the second dielectric layer 451 is formed on the first dielectric layer 441. The second dielectric layer 451 is etched to form a third via 414, and the third via 414 exposes the first connecting structure 423 and the second connecting structure 433.

Figure 29:
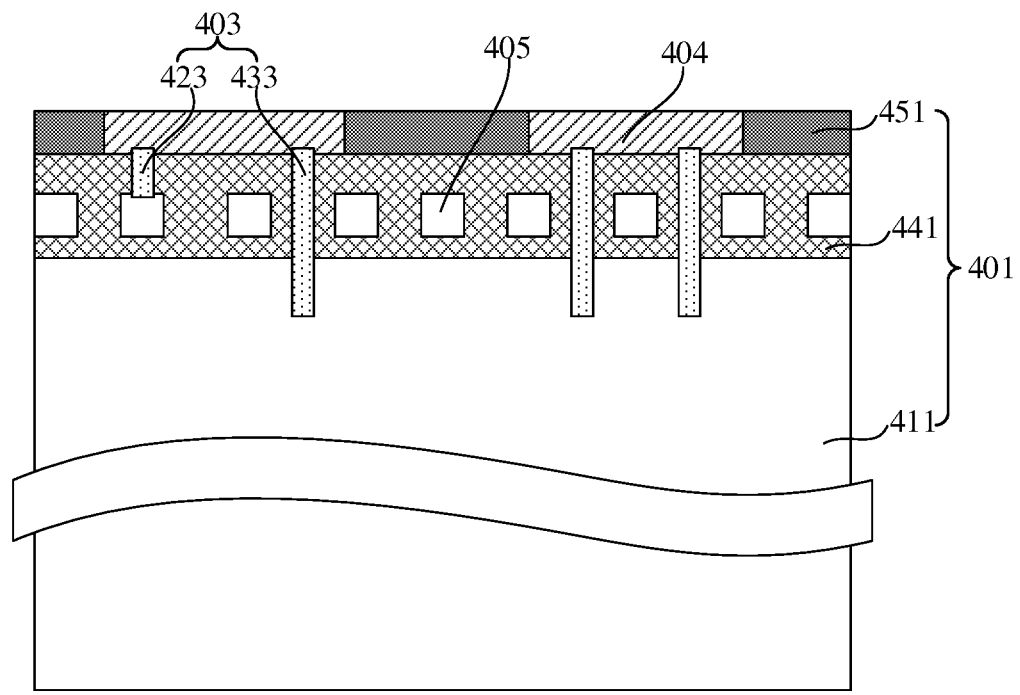
FIG. 29 is a fourth schematic diagram illustrating sectional structures corresponding to various steps of a method for manufacturing a semiconductor structure according to an embodiment of the disclosure.

Referring to FIG. 29, the third via 414 (referring to FIG. 28) is filled to form the electrical connection layer 404.

Figure 30:
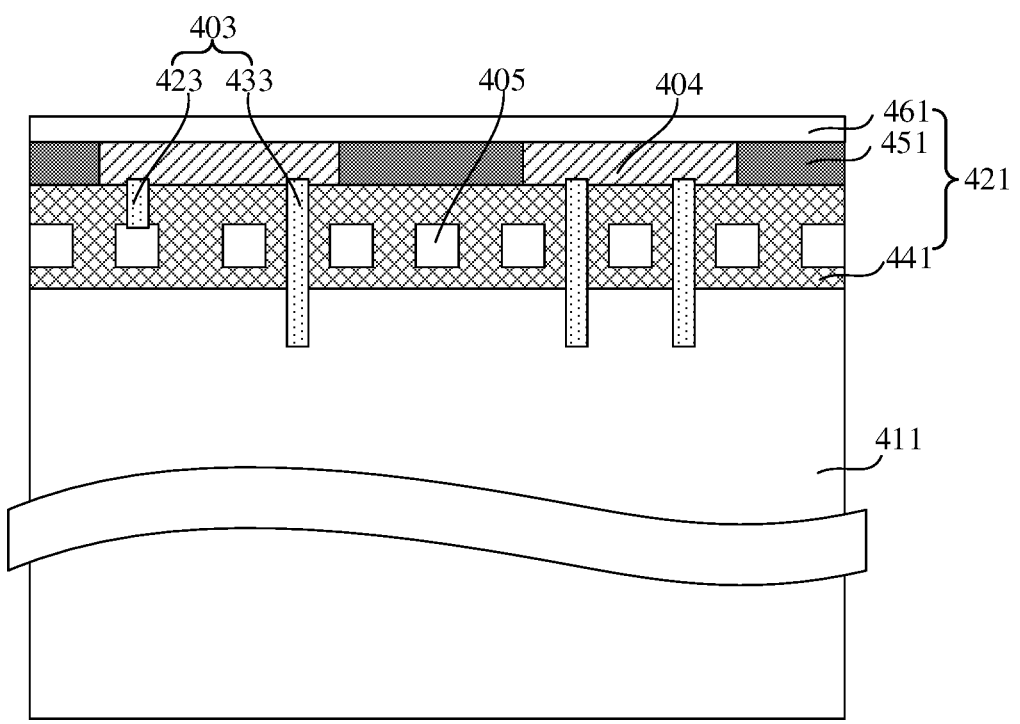
FIG. 30 is a fifth schematic diagram illustrating sectional structures corresponding to various steps of a method for manufacturing a semiconductor structure according to an embodiment of the disclosure.

In some embodiments, referring to FIG. 30, after the electrical connection layer 404 is formed, a fifth dielectric layer 461 is also formed at one side of the second dielectric layer 451 that exposes the surface of the electrical connection layer 404. It is to be noted that, in the embodiments of the disclosure, the first dielectric layer 441, the second dielectric layer 451 and the fifth dielectric layer 461 form the dielectric layer 421 together (the dielectric layer 421 corresponds to the dielectric layer 221 in FIG. 14 of the above the embodiment).

Figure 31:
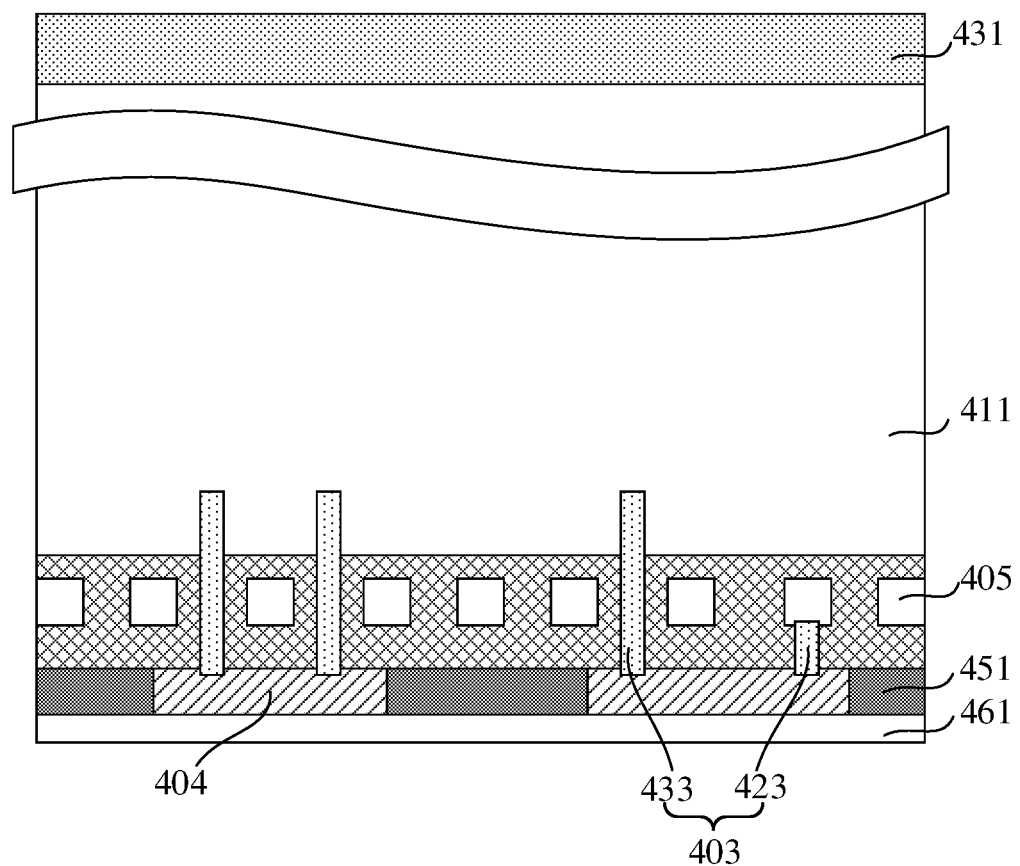
FIG. 31 is a sixth schematic diagram illustrating sectional structures corresponding to various steps of a method for manufacturing a semiconductor structure according to an embodiment of the disclosure.

Referring to FIG. 31, the surface of the substrate 411 distal from the first dielectric layer 441 is polished, for example, the polishing method includes chemical mechanical polishing. Then, the third dielectric layer 431 is formed at one side, distal from the first dielectric layer 441, of the substrate 411.

Figure 32:
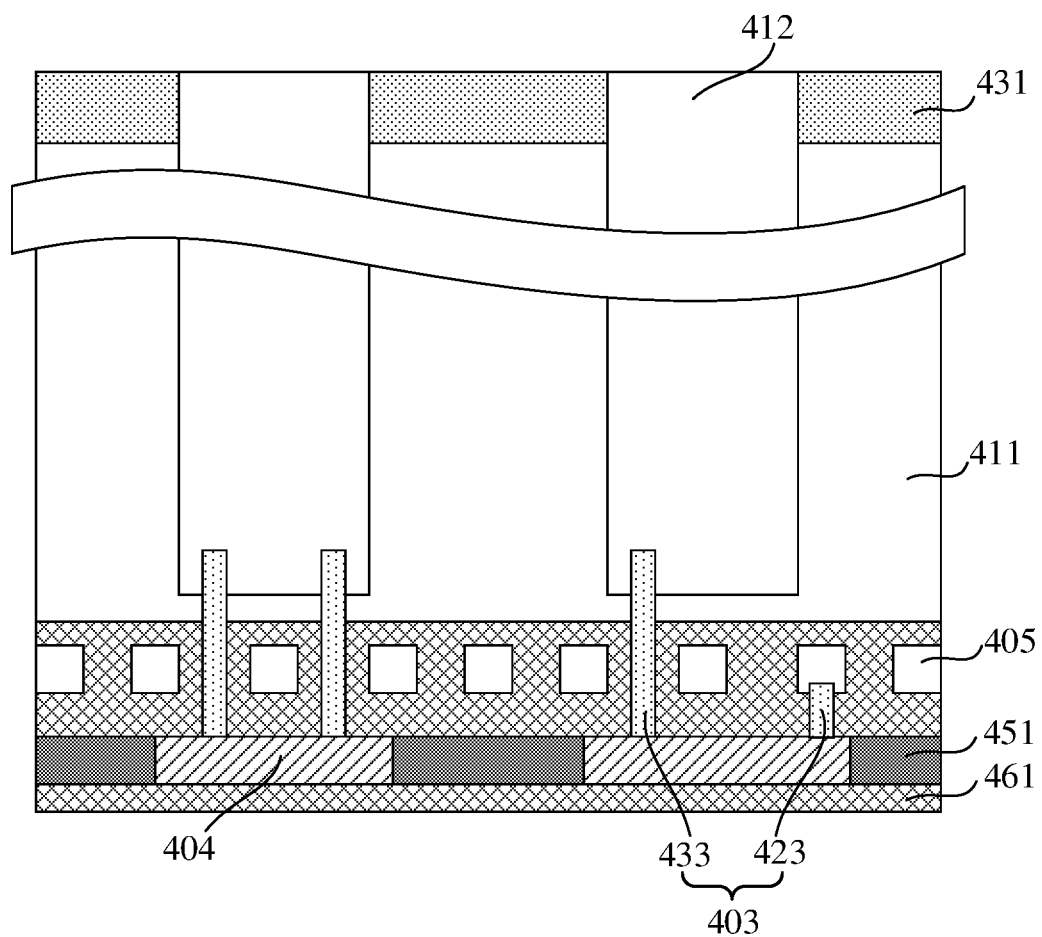
FIG. 32 is a seventh schematic diagram illustrating sectional structures corresponding to various steps of a method for manufacturing a semiconductor structure according to an embodiment of the disclosure.

Referring to FIG. 32, the third dielectric layer 431 and the substrate 411 are etched to form a second via 412, and the second via 412 exposes the second connecting structure 433.

Referring to FIG. 14 in the above embodiments of the disclosure, the second via 412 (referring to FIG. 32) is filled to form the conductive pillar 202.

In the embodiments of the disclosure, when the connecting structure is manufactured, at least one connecting structure is electrically connected to the conductive pillar, and at least one connecting structure is electrically connected to the first structure, such that the electric signal transmitted by the conductive pillar may be transmitted to the first structures through the electrical connection layer, which is beneficial to improve the diversity of the signal transmission in the semiconductor structure.

Those of ordinary skill in the art may understand that the above implementation modes are some embodiments for realizing the disclosure. However, in an actual application, various modifications may be made to the forms and details without departing from the spirit and scope of the disclosure. Those skilled in the art may make any variation and modification without departing from the spirit and scope of the disclosure. Therefore, the scope of protection of the disclosure shall be subject to the scope of the claims.

What is claimed is:

1. A semiconductor structure, comprising:
a base;
a conductive pillar at least located in the base;
at least two connecting structures spaced apart, at least one connecting structure being electrically connected to an end of the conductive pillar, a material of the connecting structure being different from that of the conductive pillar, and a total area of an orthographic projection of the connecting structure on the base being less than an area of an orthographic projection of the conductive pillar on the base;
an electrical connection layer electrically connected to an end of the connecting structure distal from the conductive pillar;
at least one first structure, part of first structures being arranged around the connecting structures or interspersed in a spacing of a plurality of connecting structures, and the first structures being configured to generate or transmit an electric signal of the semiconductor structure; and
at least another connected structure is electrically connected with the first structure.

2. The semiconductor structure of claim 1, wherein the connecting structure has a first end surface and an opposite second end surface, the first end surface is in contact with an end surface of the conductive pillar or the first end surface is embedded into the conductive pillar, and the second end surface is in contact with an end surface of the electrical connection layer or the second end surface is embedded into the electrical connection layer.

3. The semiconductor structure of claim 1, wherein a ratio of the total area of the orthographic projection of the connecting structure on the substrate to the area of the orthographic projection of the conductive pillar on the substrate is ranged from 1/10 to 1/5.

4. The semiconductor structure of claim 1, wherein the conductive pillar is a through silicon via (TSV).

5. The semiconductor structure of claim 1, wherein a thermal expansion coefficient of the material of the connecting structure is less than that of the material of the conductive pillar.

6. The semiconductor structure of claim 5, wherein the material of the connecting structure comprises doped polycrystalline silicon and a metal material.

7. The semiconductor structure of claim 1, wherein one connecting structure forms a closed ring structure, and the first structures are located around the connecting structure.

8. The semiconductor structure of claim 1, wherein at least two connecting structures form a ring structure, and the first structures are located in the spacings of the plurality of connecting structures.

9. The semiconductor structure of claim 1, wherein at least two connecting structures are spaced around a central axis of the conductive pillar, and the first structures are located in the spacings of the plurality of connecting structures.

10. The semiconductor structure of claim 1, wherein the connecting structure and the first structures are fin-shaped structures, and the first structures are located at two sides of the connecting structure.

11. The semiconductor structure of claim 1, wherein the base comprises a substrate and a dielectric layer stacked in sequence, the electrical connection layer is located in the dielectric layer, and the connecting structures are located in the dielectric layer or the connecting structures are located in the dielectric layer or the substrate.

12. The semiconductor structure of claim 1, wherein a thermal expansion coefficient of the material of the connecting structure is less than that of a material of the electrical connection layer.

* * * * *